(12) United States Patent
Scott

(10) Patent No.: US 6,367,263 B1
(45) Date of Patent: Apr. 9, 2002

(54) INTEGRATED CIRCUIT REFRIGERATION DEVICE

(75) Inventor: Brian A. Scott, El Dorado Hills, CA (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 09/583,802

(22) Filed: May 31, 2000

(51) Int. Cl.[7] .............................. F25B 9/00; F25D 15/00
(52) U.S. Cl. ...................... 62/6; 62/259.2; 165/104.26; 165/104.27; 165/104.31
(58) Field of Search .................. 62/6, 259.2, 467; 165/104.21, 104.26, 104.27, 104.28, 104.31, 104.32, 104.33

(56) References Cited

U.S. PATENT DOCUMENTS

| | | | |
|---|---|---|---|
| 4,165,607 A | 8/1979 | Fedorowicz et al. | 58/50 R |
| 4,679,118 A | 7/1987 | Johnson et al. | 361/386 |
| 4,853,762 A | 8/1989 | Ewer et al. | 357/79 |
| 4,869,250 A * | 9/1989 | Bitterly | 128/400 |
| 4,916,523 A | 4/1990 | Sokolovsky et al. | 357/74 |
| 5,073,116 A | 12/1991 | Beck, Jr. | 439/71 |
| 5,097,387 A | 3/1992 | Griffith | 361/385 |
| 5,163,551 A | 11/1992 | Bhatia | 206/334 |
| 5,282,111 A | 1/1994 | Hopfer | 361/704 |
| 5,319,938 A | 6/1994 | Lucas | 62/6 |
| 5,329,426 A | 7/1994 | Villani | 361/719 |
| 5,331,510 A | 7/1994 | Ouchi et al. | 361/702 |
| 5,343,358 A * | 8/1994 | Hilbrink | 361/700 |
| 5,357,404 A | 10/1994 | Bright et al. | 361/818 |
| 5,357,757 A | 10/1994 | Lucas | 62/6 |
| 5,435,152 A * | 7/1995 | McCausland | 62/467 |
| 5,491,981 A * | 2/1996 | Kim | 62/324.6 |
| 5,515,684 A | 5/1996 | Lucas et al. | 62/6 |
| 5,579,399 A | 11/1996 | Lucas | 381/165 |
| 5,602,719 A | 2/1997 | Kinion | 361/704 |
| 5,621,615 A | 4/1997 | Dawson et al. | 361/704 |
| 5,642,262 A | 6/1997 | Terrill et al. | 361/783 |
| 5,699,227 A | 12/1997 | Kolman et al. | 361/700 |
| 5,801,929 A | 9/1998 | Cheng | 361/807 |
| 5,802,707 A | 9/1998 | Brownell et al. | 29/740 |
| 5,864,478 A | 1/1999 | McCutchan et al. | 363/147 |
| 5,875,095 A | 2/1999 | Webb | 361/700 |
| 5,880,524 A | 3/1999 | Xie | 257/704 |
| 5,892,293 A | 4/1999 | Lucas | 290/1 R |
| 5,903,436 A | 5/1999 | Brownell et al. | 361/704 |
| 5,949,647 A | 9/1999 | Kolman et al. | 361/700 |
| 5,949,648 A | 9/1999 | Liao | 361/700 |
| 5,982,635 A | 11/1999 | Menzies et al. | 361/790 |
| 5,990,549 A | 11/1999 | Chiu et al. | 257/706 |
| 5,994,854 A | 11/1999 | Lawrenson et al. | 318/114 |
| 6,021,044 A | 2/2000 | Nevelle, Jr. et al. | 361/700 |
| 6,046,905 A | 4/2000 | Nelson et al. | 361/704 |
| 6,052,285 A * | 4/2000 | Hileman | 361/699 |
| 6,058,013 A | 5/2000 | Christopher et al. | 361/704 |
| 6,065,530 A | 5/2000 | Austin et al. | 165/80.3 |
| 6,119,474 A * | 9/2000 | Augustine et al. | 62/259.3 |

FOREIGN PATENT DOCUMENTS

JP 07-113840 5/1995 ............ G01R/31/26

\* cited by examiner

*Primary Examiner*—William C. Doerrler
(74) *Attorney, Agent, or Firm*—Schwegman, Lundberg, Woessner & Kluth, P.A.

(57) ABSTRACT

A heat pipe includes a flow diverter that separates the heat pipe into an evaporator chamber and a condenser chamber. Each of the evaporator chamber and the condenser chamber are coupled to a compressor with a one-way valve. The compressor receives vaporous working fluid from the evaporator chamber, compresses it, and pumps it to the condenser chamber at a higher pressure and temperature. Within the condenser chamber, the working fluid enter a wicking structure and travels around the flow diverter to the evaporator chamber. The compressor can be an acoustic compressor that includes an acoustic resonating chamber. An integrated circuit package can include the combination of the heat pipe and compressor to create a refrigeration cycle that removes heat from an integrated circuit.

29 Claims, 2 Drawing Sheets

INTEGRATED CIRCUIT REFRIGERATION DEVICE

FIELD

The present invention relates generally to integrated circuit cooling systems, and more specifically to integrated circuit cooling systems employing heat pipes.

BACKGROUND OF THE INVENTION

Integrated circuit technology continues to advance at a rapid rate. Advancements include increases in integrated circuit die density which allows for ever-increasing amounts of circuitry in any given die size, and also include increases in speeds at which integrated circuits operate. Higher integrated circuit die densities and increased integrated circuit speeds combine to increase the computational speed in computers and other electronic devices.

Along with increased density and speed of integrated circuit devices comes increased power consumption. State-of-the-art integrated circuits can consume considerable amounts of power, much of which gets dissipated as heat. The problem of increased heat dissipation is exacerbated by the fact that as integrated circuit dice shrink, the amount of heat to be dissipated per unit area of integrated circuit die increases.

Heat is typically dissipated from integrated circuit dice through packages in which they are housed. A surface area of the integrated circuit die is typically thermally bonded to a part of the package for the purpose of dissipating heat from the die. The use of a heat pipe is one known mechanism for transferring heat away from an integrated circuit. A description of a heat pipe can be found in U.S. Pat. No. 5,880,524, issued May 9, 1999 to Hong Xie.

As integrated circuit densities continue to increase, and the associated quantities of heat also increase, the problem of transferring heat away from integrated circuits becomes even more difficult.

For the reasons stated above, and for other reasons stated below which will become apparent to those skilled in the art upon reading and understanding the present specification, there is a need in the art for an alternate method and apparatus to efficiently transfer heat.

DESCRIPTION OF EMBODIMENTS

Figure 1:
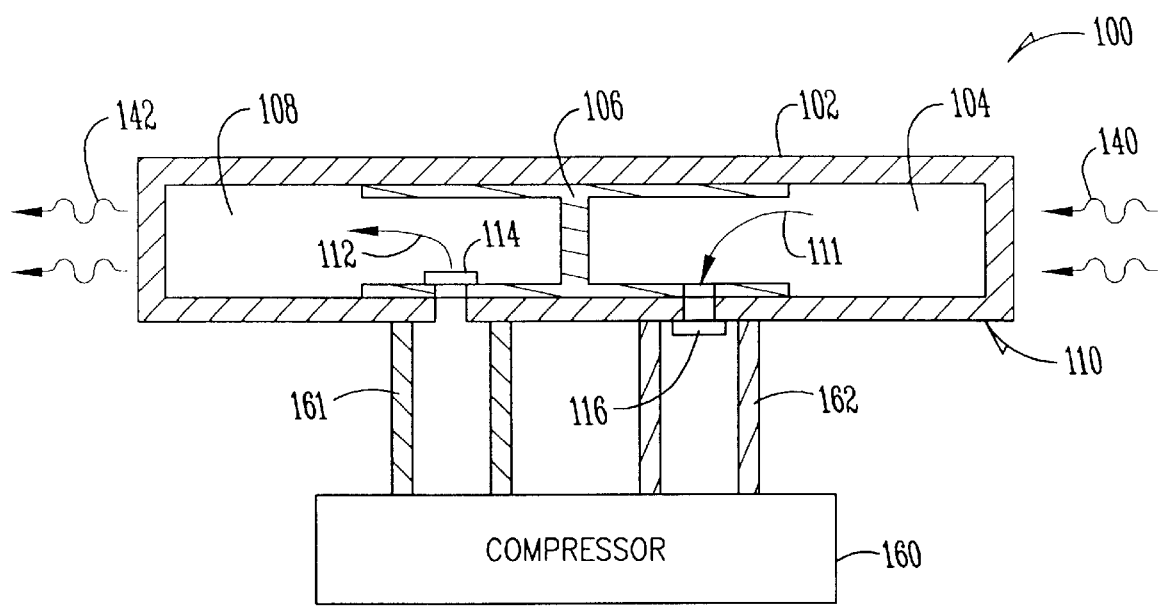
FIG. 1 shows a cross section of a refrigeration system employing a heat pipe.

In the following detailed description of the embodiments, reference is made to the accompanying drawings that show, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. Moreover, it is to be understood that the various embodiments of the invention, although different, are not necessarily mutually exclusive. For example, a particular feature, structure, or characteristic described in one embodiment may be included within other embodiments. The following detailed description is, therefore, not to be taken in a limiting sense, and the scope of the present invention is defined only by the appended claims, along with the full scope of equivalents to which such claims are entitled.

The method and apparatus of the present invention provide a mechanism for generating a refrigeration cycle with a heat pipe. A heat pipe with a wicking structure and a working fluid is divided into two separate chambers by a flow diverter. Each chamber is coupled to a compressor, and each chamber is coupled to the other by the wicking structure in the heat pipe. One chamber is an evaporator chamber and the other chamber is a condenser chamber. The working fluid in the wicking structure adjacent to the evaporator chamber receives heat and evaporates to become a vapor. The vapor is compressed in the compressor and enters the condenser chamber as a vapor. The vapor condenses into the wicking structure, releases heat, and returns to the evaporator chamber.

In some embodiments, the compressor is an acoustic compressor that includes an acoustic resonating chamber. The acoustic resonating chamber has a standing pressure wave set up by a vibrating leaf spring. The vibrating leaf spring can be in the compressor, the evaporator chamber, or the condenser chamber. In some embodiments the leaf spring is made of a piezoelectric material excited at the resonant frequency of the acoustic resonating chamber.

An integrated circuit package employs the refrigeration system to remove heat from an integrated circuit. The result is a compact, efficient, refrigeration cycle device that can remove heat from an integrated circuit under extreme heat conditions.

FIG. 1 shows a cross section of a refrigeration system employing a heat pipe. Refrigeration system 100 includes heat pipe 110 and compressor 160. Heat pipe 110 includes evaporator chamber 104 and condenser chamber 108 separated by flow diverter 106. Evaporator chamber 104 and condenser chamber 108 are coupled to each other by wicking structure 102 around the perimeter of heat pipe 110.

Wicking structure 102 is a porous material through which working fluid can travel from condenser chamber 108 to evaporator chamber 104. Flow diverter 106 is a solid material that forms a barrier between evaporator chamber 104 and condenser chamber 108 such that a pressure differential between the two chambers can be supported. The working fluid within refrigeration system 100 is a multi-phase liquid that can change between a liquid and a vapor at the operating temperatures and pressures of refrigeration system 100. In some embodiments, the working fluid is water. In other embodiments, the working fluid is methanol, Freon, or a Freon substitute.

Figure 3:
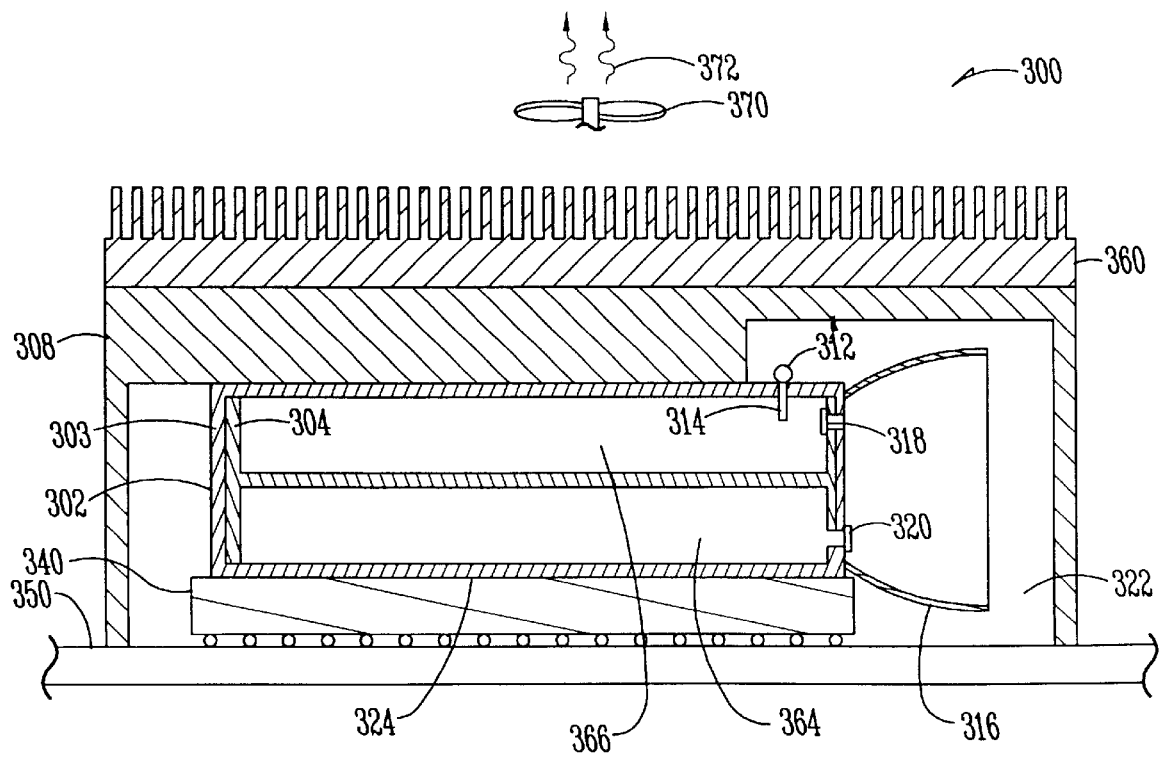
FIG. 3 shows a cross section of an integrated circuit package.

The cross section of heat pipe 110 as shown in FIG. 1 is rectangular, but this is not a limitation of the present invention. Heat pipe 110 can be any shape. For example, heat pipe 110 can be rectangular, cylindrical, spherical, or any other shape useful for a particular application. In some embodiments, heat pipe 110 is shaped to conform to a surface of an item being cooled. For example, heat pipe 110 can be a rectangle of sufficient size to be thermally coupled to an integrated circuit. This is shown in FIG. 3, and described below with reference thereto.

Compressor 160 is coupled to heat pipe 110 by one-way valves 116 and 114 and tubes 161 and 162. Compressor 160 can be any type of compressor capable of creating pressure differentials sufficient to operate one-way valves 114 and 116, and to nearly adiabatically compress the vapor to higher temperature and pressure. In some embodiments, compressor 160 is a continuously rotating device such as a screw compressor or a turbine compressor. In other embodiments, compressor 160 is a reciprocating device, such as a piston compressor. In other embodiments, compressor 160 is an acoustic compressor.

Refrigeration system 100 operates as an integral part of a refrigeration cycle. In other words, refrigeration system 100 includes elements that represent the four parts of a refrigeration device: evaporator, compressor, condenser, and expansion valve. During the refrigeration cycle, working fluid within wicking structure 102 absorbs heat 140 and evaporates into evaporator chamber 104. The working fluid then travels as a vapor from evaporator chamber 104 through one-way valve 116 and enters compressor 160. This working fluid flow is shown at 111. Compressor 160 compresses the vapor to higher pressure and temperature. This compressed vapor enters condenser chamber 108 through one-way valve 114. This working fluid flow is shown at 112.

Working fluid within condenser chamber 108 is at a higher temperature and higher pressure than the vaporous working fluid in evaporator chamber 104. Within condenser chamber 108, high temperature working fluid enters wicking structure 102 changing phase from a vapor to a liquid and dissipating heat 142 through the wall of heat pipe 110 in the process. Because flow diverter 106 separates evaporator chamber 104 and condenser chamber 108, and condenser chamber 108 is at a higher pressure than evaporator chamber 104, the working fluid travels through wicking structure 102 around flow diverter 106 to evaporator chamber 104. Wicking structure 102 operates as a throttling device in a refrigeration cycle. The working fluid arrives in evaporator chamber 104 at a lower pressure and temperature, ready to receive heat and start the refrigeration cycle once again.

Figure 2A:
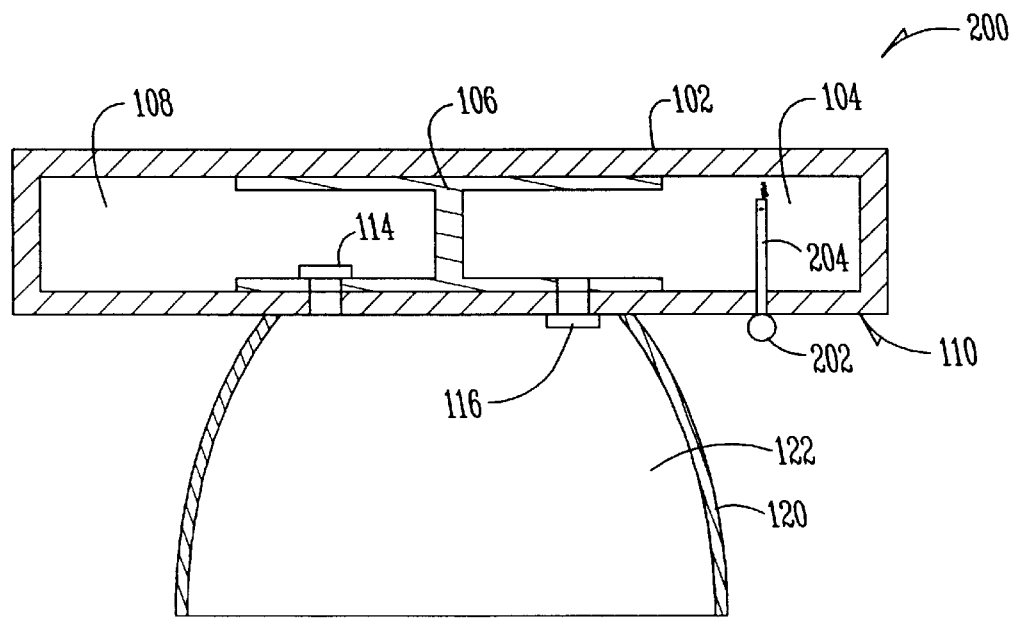
FIGS. 2A and 2B show cross sections of refrigeration systems according to multiple embodiments of the invention.

FIG. 2A shows a cross section of a refrigeration system. Refrigeration system 200 includes heat pipe 110 and acoustic compressor 120. Acoustic compressor 120 includes acoustic resonating chamber 122, which is coupled to heat pipe 110 by one-way valves 116 and 114. Acoustic compressors and acoustic resonating chambers are described in U.S. Pat. No. 5,319,938, issued Jun. 14, 1994 to Timothy Lucas. A standing pressure wave within acoustic resonating chamber 122 is produced by leaf spring valve 204.

Leaf spring valve 204 is an example of a pressure wave creating element. Leaf spring valve 204 vibrates at the resonant frequency of acoustic resonating chamber 122, and causes pressure waves to develop in evaporator chamber 104. As a result, one-way valve 116 opens at the resonant frequency of acoustic resonating chamber 122 and causes working fluid to pass therethrough. The action of working fluid traveling through one-way valve 116 sets up a standing pressure wave within acoustic resonating chamber 122, and the operation of refrigeration system 200 continues substantially the same as the operation of refrigeration system 100.

Acoustic resonating chamber 122 is shaped such that a small excitation from a pressure wave creating element can create a standing pressure wave that resonates therein. In some embodiments, the standing pressure wave in acoustic resonating chamber 122 is generated with a pressure wave creating element in conjunction with, or in lieu of, leaf spring valve 204. For example, a standing pressure wave within acoustic resonating chamber can be generated with a piston coupled to an open end of acoustic originating chamber 122, an electromagnetic shaker, an electromagnetic driver, a spinning device, or the like.

In the embodiment shown in FIG. 2A, leaf spring valve 204 protrudes through the outer wall of heat pipe 110 and wicking structure 102. Terminal 202 resides on one end of leaf spring valve 204. In some embodiments, leaf spring valve 204 is made of a piezoelectric material, and vibrates when an electric potential is applied. In these embodiments, terminal 202 includes an electrical contact to which an electric potential can be applied.

Acoustic compressor 120 operates with a standing pressure wave such that the area within acoustic resonating chamber 122 near heat pipe 110 oscillates in pressure from high pressure to low pressure. At points in time where the pressure within evaporator chamber 104 is higher than the pressure in acoustic resonating chamber 122, one-way valve 116 opens and vaporous working fluid travels from evaporator chamber 104 to acoustic resonating chamber 122. As the pressure in acoustic resonating chamber 122 near heat pipe 110 increases, one-way valve 116 closes and one-way valve 114 opens. Working fluid then moves from acoustic resonating chamber 122 into condenser chamber 108. As long as the standing pressure wave is oscillating within acoustic resonating chamber 122, acoustic compressor 120 continues to pump working fluid from evaporator chamber 104 to condenser chamber 108.

Figure 2B:
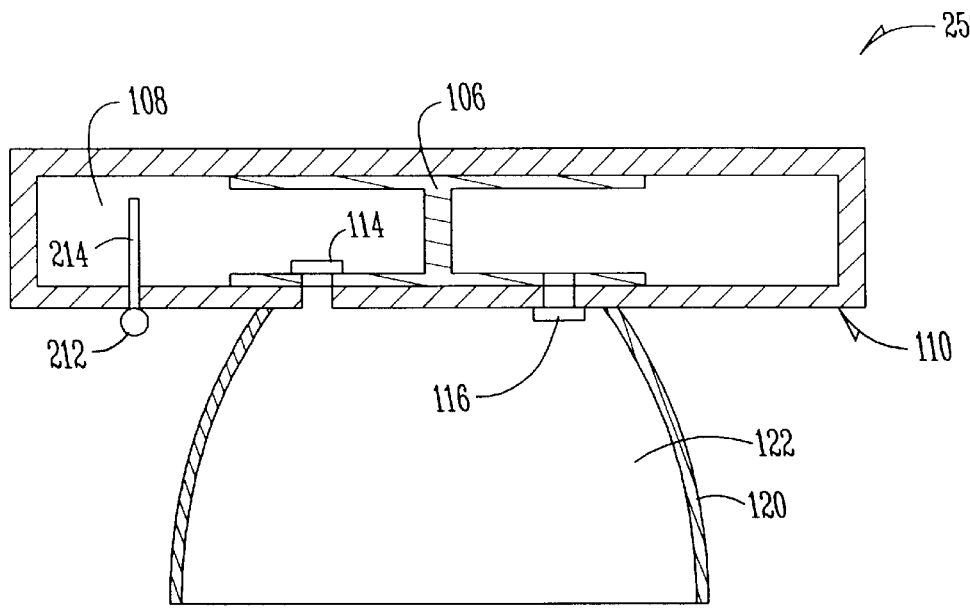

FIG. 2B shows a cross section of another refrigeration system. Refrigeration system 250 includes leaf spring valve 214 within condenser chamber 108. As leaf spring valve 214 vibrates, one-way valve 114 opens and closes, and establishes a standing pressure wave within acoustic resonating chamber 122. The standing pressure wave within acoustic resonating chamber 122 creates an oscillating pressure wave near heat pipe 110, and the refrigeration cycle operates substantially the same as that of refrigeration system 200.

FIG. 3 shows a cross section of an integrated circuit package. Integrated circuit package 300 includes substrate 350 and cover 308. The combination of substrate 350 and cover 308 form cavity 322. Integrated circuit 340, heat pipe 302, and acoustic compressor 316 reside within cavity 322. Integrated circuit 340 is electrically coupled to substrate 350 and thermally coupled to heat pipe 302 at an integrated circuit mating surface of heat pipe 302.

Heat pipe 302 includes flow diverter 304 which divides heat pipe 302 into evaporator chamber 364 and condenser chamber 366, and also functions as a thermal insulator therebetween. Leaf spring valve 314 located in condenser chamber 366 vibrates and causes one-way valve 318 to periodically open, setting up a standing pressure wave within acoustic compressor 316. When acoustic compressor 316 has a standing pressure wave therein, the refrigeration cycle occurs. The refrigeration cycle draws low pressure vaporous working fluid through one-way valve 320 from evaporator chamber 364 into acoustic compressor 316, and pumps high-pressure vaporous working fluid through one-way valve 318 into condenser chamber 366. Heat is transferred to cover 308 as working fluid travels into wicking structure 303. Working fluid travels around flow diverter 304, through wicking structure 303 and into evaporator chamber 364, and the refrigeration cycle repeats.

As previously described, heat travels from heat pipe 302 to cover 308. Heat continues from cover 308 to heat sink 360 where it is dissipated. In some embodiments, integrated circuit package 300 includes fan 370 to increase airflow across heat sink 360 and to increase heat transfer efficiency. Fan 370 can be a fan fastened to heat sink 360, or can be a fan fastened to another structure and positioned to create airflow across heat sink 360.

FIG. 3 shows leaf spring valve 314 within condenser chamber 366. In some embodiments, leaf spring valve 314 is within evaporator chamber 364. In other embodiments, leaf spring valve 314 is within acoustic compressor 316. Leaf spring valve 314 directly produces a standing pressure wave within acoustic compressor 316 when leaf spring valve 314 is within acoustic compressor 316, and indirectly produces a standing pressure wave within acoustic compressor 316 when in either evaporator chamber 364 or condenser chamber 366. A standing pressure wave can also be generated with mechanical structures, such as a piston or the like.

Cover 308 is shown thermally coupled between heat pipe 302 and heat sink 360. In some embodiments, heat sink 360 is coupled directly to heat pipe 302 without cover 308 therebetween. In addition, FIG. 3 shows cover 308 shaped to accommodate acoustic compressor 316 which is shown larger than heat pipe 302 in at least one dimension, but this is not a limitation of the present invention. For example, in some embodiments, acoustic compressor 316 is smaller than heat pipe 302. Also in some embodiments, leaf spring valve 314 is not located at the top of heat pipe 302, but is located at a side. In these embodiments, cover 308 can be symmetric such that cavity 322 is a uniform shape.

The method and apparatus of the present invention provides a compact and efficient refrigeration cycle unit capable of removing large amounts of heat from integrated circuits. Previously known mechanisms for generating a refrigeration cycle typically include a separate compressor, evaporator, condenser, and distributed tubing coupling the various components. In contrast, the method and apparatus of the present invention provide a compact unit capable of delivering a refrigeration cycle without the distributed components typically associated therewith.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the fall scope of equivalents to which such claims are entitled.

What is claimed is:

1. A refrigeration system comprising:
   a wicking structure;
   a working fluid in contact with the wicking structure; and
   a compressor configured to pump the working fluid, wherein the compressor comprises an acoustic resonating chamber.

2. The refrigeration system of claim 1 wherein the acoustic resonating chamber is configured to be excited mechanically to create standing pressure waves within the working fluid.

3. The refrigeration system of claim 1 further including a flow diverter to create a high pressure condenser chamber and a low pressure evaporator chamber, the high pressure condenser chamber and the low pressure evaporator chamber being fluidly coupled by the wicking structure.

4. The refrigeration system of claim 3 further including a first one-way valve from the low pressure evaporator chamber to the acoustic resonating chamber, and a second one-way valve from the acoustic resonating chamber to the high pressure condenser chamber.

5. The refrigeration system of claim 3 further including a leaf spring valve within the low pressure evaporator chamber, the leaf spring valve being configured to vibrate and create acoustic pressure waves within the working fluid.

6. The refrigeration system of claim 5 wherein the leaf spring valve is comprised of a piezoelectric material.

7. A heat pipe cooling system comprising:
   an acoustic compressor having an acoustic resonating chamber; and
   a heat pipe fluidly coupled to the acoustic compressor, wherein the heat pipe includes a flow diverter dividing the heat pipe into an evaporator chamber and a condenser chamber, and the heat pipe further includes a wicking structure coupling the evaporator chamber and the condenser chamber.

8. The heat pipe cooling system of claim 7 further comprising:
   a first one-way valve that fluidly couples the evaporator chamber to the acoustic resonating chamber; and
   a second one-way valve that fluidly couples the acoustic resonating chamber to the condenser chamber.

9. The heat pipe cooling system of claim 7 wherein fluid within the acoustic resonating chamber is configured to be excited by a mechanical apparatus.

10. The heat pipe cooling system of claim 7 wherein fluid within the acoustic resonating chamber is configured to be excited by an electrical apparatus.

11. The heat pipe cooling system of claim 7 further including a piezoelectric pressure wave creating element within the evaporator chamber.

12. The heat pipe cooling system of claim 7 further including a piezoelectric pressure wave creating element within the condenser chamber.

13. An integrated circuit package comprising:
    a heat pipe having an integrated circuit mating surface; and
    an acoustic compressor fluidly coupled to the heat pipe.

14. The integrated circuit package of claim 13 further comprising an integrated circuit die thermally coupled to the integrated circuit mating surface of the heat pipe.

15. The integrated circuit package of claim 13 wherein the heat pipe includes two chambers, each being coupled to the acoustic compressor by a one-way valve.

16. The integrated circuit package of claim 15 further including a leaf spring valve in at least one of the two chambers, the leaf spring valve being configured to generate an acoustic pressure wave, such that working fluid of the heat pipe leaves one of the two chambers and enters the acoustic compressor at a first pressure, and the working fluid leaves the acoustic compressor and enters the other of the two chambers at a second pressure, the second pressure being greater than the first pressure.

17. The integrated circuit package of claim 16 wherein the heat pipe comprises a wicking structure coupling the two chambers.

18. The integrated circuit package of claim 16 further comprising a heat sink thermally coupled to the heat pipe.

19. The integrated circuit package of claim 16 further comprising a fan thermally coupled to the heat pipe.

20. The integrated circuit package of claim 16 wherein the leaf spring valve is comprised of a piezoelectric material.

21. An integrated circuit cooling device comprising:
    a heat pipe having a wicking structure between an evaporator chamber and a condenser chamber;
    a flow diverter within the heat pipe, the flow diverter being configured to divert working fluid flow through the wicking structure from the condenser chamber to the evaporator chamber; and
    a compressor fluidly coupled to the evaporator chamber and the condenser chamber.

22. The integrated circuit cooling device of claim 21 wherein the compressor comprises an acoustic resonating chamber having a resonant frequency.

23. The integrated circuit cooling device of claim 22 further comprising a pressure wave creating element configured to create pressure waves at the resonant frequency of the acoustic resonating chamber.

24. The integrated circuit cooling device of claim 23 wherein the pressure wave creating element comprises a piezoelectric material.

25. The integrated circuit cooling device of claim 23 wherein the pressure wave creating element is configured to create the pressure waves in the evaporator chamber of the heat pipe.

26. The heat pipe cooling system of claim 3 further including a piezoelectric pressure wave creating element within the low pressure evaporator chamber.

27. The heat pipe cooling system of claim 3 further including a piezoelectric pressure wave creating element within the high pressure condenser chamber.

28. The heat pipe cooling system of claim 8 further including a piezoelectric pressure wave creating element within the evaporator chamber.

29. The heat pipe cooling system of claim 8 further including a piezo electric pressure wave creating element within the condenser chamber.

* * * * *

UNITED STATES PATENT AND TRADEMARK OFFICE
CERTIFICATE OF CORRECTION

PATENT NO. : 6,367,263 B1
DATED : April 9, 2002
INVENTOR(S) : Scott

It is certified that error appears in the above-identified patent and that said Letters Patent is hereby corrected as shown below:

<u>Title page,</u>
Item [56], References Cited, U.S. PATENT DOCUMENTS, delete "6/1994 Lucas", and insert -- 6/1996 Lucas --, therefor.

<u>Column 5,</u>
Line 41, delete "fall" and insert -- full --, therefor.

<u>Column 8,</u>
Line 11, delete "piezo electric" and insert -- piezoelectric, -- therefor.

Signed and Sealed this

Twenty-fourth Day of September, 2002

Attest:

Attesting Officer

JAMES E. ROGAN
Director of the United States Patent and Trademark Office